(12) United States Patent
Jin et al.

(10) Patent No.: US 6,940,169 B2
(45) Date of Patent: Sep. 6, 2005

(54) TORCH BUMP

(75) Inventors: Yong Gang Jin, Singapore (SG); Won Sun Shin, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 10/791,095

(22) Filed: Mar. 1, 2004

(65) Prior Publication Data

US 2004/0178503 A1 Sep. 16, 2004

Related U.S. Application Data

(62) Division of application No. 10/151,977, filed on May 21, 2002, now Pat. No. 6,740,577.

(51) Int. Cl.$^7$ .............................................. H01L 23/48
(52) U.S. Cl. ...................... 257/738; 257/780; 257/781; 257/737
(58) Field of Search ................................ 257/737–738, 257/779–781

(56) References Cited

U.S. PATENT DOCUMENTS

| 6,426,281 | B1 | * | 7/2002 | Lin et al. | 438/612 |
| 6,492,197 | B1 | * | 12/2002 | Rinne | 438/108 |
| 6,541,366 | B1 | * | 4/2003 | Chin et al. | 438/613 |
| 6,586,322 | B1 | * | 7/2003 | Chiu et al. | 438/612 |

* cited by examiner

*Primary Examiner*—Thanh Nguyen
(74) *Attorney, Agent, or Firm*—Mikio Ishimaru (57) ABSTRACT

A torch bump is provided, which is a solder bump comprising a base over which a solder bump is created. A first layer of dry film is over a supporting surface over which first a layer of UBM has been deposited. A base for the solder bump is created in a first opening through the first layer of dry film, the base aligns with an underlying contact pad. A second dry film is over the surface of the first dry film, a second opening is created through the second dry film that aligns with the created base of the solder bump. The opening through the second dry film is filled with solder by solder printing, the first and second layers of dry film are removed, the deposited layer of UBM is etched. Reflow is applied to the deposited solder, creating the torch solder bump.

16 Claims, 6 Drawing Sheets

TORCH BUMP

CROSS-REFERENCE TO RELATED APPLICATION(S)

This is a divisional of application Ser. No. 10/151,977 filed May 21, 2002, now U.S. Pat. No. 6,140,577, which is hereby incorporated by reference herein.

BACKGROUND OF THE INVENTION (1) Field of the Invention

The invention, relates to the fabrication of integrated circuit devices, and more particularly, to a method of creating a fine pitch, high-density solder bump.

(2) Description of the Prior Art

With continuously decreasing semiconductor device dimensions and increasing device packaging densities, the packaging of semiconductor device continues to gain increased importance. Metal interconnects, thereby including points of metal contact such as solder bumps, which connect semiconductor devices to surrounding circuits, have therefore become of relative more importance.

The increasing need for creating device interconnect traces or networks has led to the application of low resistance metals, such as copper, for the interconnect traces while dielectrics having a low dielectric constant or other interfacing layers such as air gaps or cavities are increasingly used in between signal lines. Another approach to solve problems of I/O interconnect capability has been to design chips and chip packaging methods that offer dependable methods of increased interconnecting of chips at a reasonable manufacturing cost. This has led to the development of Flip Chip Packages.

Flip-chip technology uses bumps (typically comprising Pb/Sn solders) formed over aluminum contact pads on the semiconductor devices and interconnects the bumps directly to a packaging media, which are usually ceramic or plastic or organic material based. The flip-chip is bonded face down to the package medium through the shortest paths. These technologies can be applied not only to single-chip packaging, but also to higher levels of packaging, in which the packages are larger, and to more sophisticated substrates that have multiple layers of interconnect traces and that can accommodate several chips to form larger functional units.

The flip-chip technique, using an area I/O array, has the advantage of achieving a high density of interconnect to the device combined with a very low inductance interconnection to the package. The packaging substrate is generally used for Ball Grid Array (EGA) packages but can also be used for Land Grid Array (LGA) and Pin Grid Array (PGA) packages.

The mounting of a flip chip over the surface of a printed circuit board consists of attaching the flip chip to this board or to any other matching substrate. A flip chip is a semiconductor chip that has a pattern or array of terminals spaced around the active surface of the flip chip, the flip chip is mounted with the active surface of the flip chip facing the supporting substrate. Electrical connectors that are provided on the active surface of the flip chip can consist of Ball Grid Arrays (BGA) devices and Pin Grid Arrays (PGA) devices. With the BGA device, an array of minute solder balls is disposed over the active surface of the flip chip for attachment to the surface of a supporting substrate. For PGA devices, an array of small pins extends essentially perpendicularly from the active surface of the flip chip, such that the pins conform to a specific arrangement on a printed circuit board or other supporting substrate for attachment thereto. The flip chip is bonded to the printed circuit board by refluxing the solder balls or pins of the flip chip.

With the continuing decrease in the size of the contact pads that are used to connect pre-solder bumps thereto, the pitch of the solder bumps becomes increasingly more important. The invention addresses this issue and provides a method that significantly improves the pitch of the solder bumps that interface between a semiconductor device and the device supporting substrate over which the device is mounted.

SUMMARY OF THE INVENTION

A principle objective of the invention is to decrease the pitch of an array of solder bumps.

Another objective of the invention is to create solder bumps for a high-density, high performance flip chip package.

Yet another objective of the invention is to create solder bumps for a high-density, high performance flip chip package using conventional methods of semiconductor device processing.

A still further objective of the invention is to provide a highly integratable and manufacturable method of creating solder bumps for a high-density, high performance flip chip package.

In accordance with the objectives of the invention a new method and sequence is provided for the creation of solder bumps. The design of the invention implements a torch bump, which is a solder bump comprising a base over which a solder bump is created. A first layer of dry film is laminated over a supporting surface over which first a layer of UBM has been deposited. A base for the solder bump is created in a first opening created through the first layer of dry film, the created base aligns with an underlying contact pad. A second dry film is laminated over the surface of the first dry film, a second opening is created through the second dry film that aligns with the created base of the solder bump. The opening through the second dry film is filled with solder by solder printing, the first and second layers of dry film are removed, the deposited layer of UBM is etched. Reflow is applied to the deposited solder, creating the torch solder bump.

BRIEF DESCRIPTION OF THE DRAWINGS

FIGS. 3 through 9 show the method of the invention for the creation of a torch bump, as follows:

DESCRIPTION OF THE PREFERRED EMBODIMENTS

Figure 1:
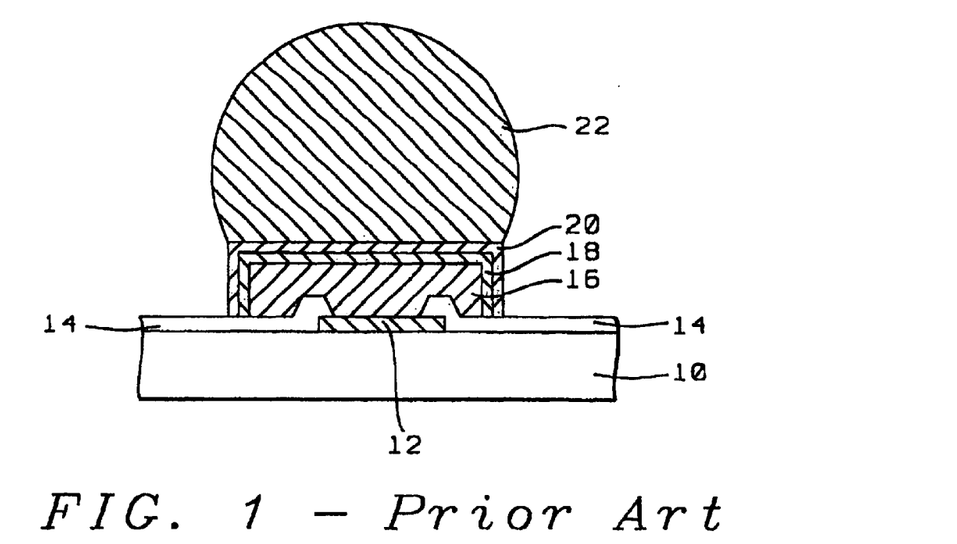
FIGS. 1 and 2 shows cross sections of Prior Art solder bumps.
Figure 2:
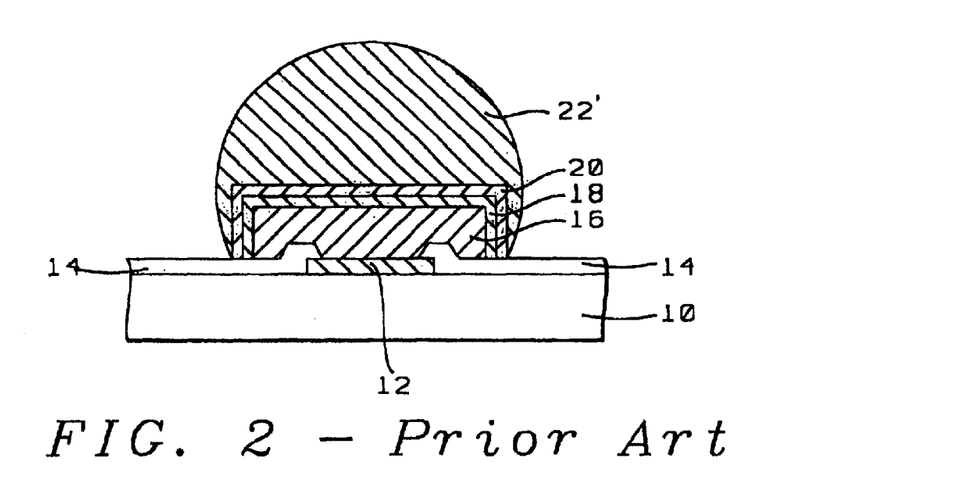

For reasons of comparison and improved understanding of the invention, comparable conventional methods of creating a solder bump are first highlighted using FIGS. 1 and 2 for this purpose.

A conventional method that is used to create a solder bump over a contact pad is next highlighted. FIG. 1 shows an example of one of the methods that is used to create an interconnect bump. A semiconductor surface 10 has been provided with a metal contact pad 12, the semiconductor surface 10 is protected with a layer 14 of passivation. An opening has been created through the layer 14 of passivation, exposing the surface of the metal contact pad 12. Overlying layers 16, 18 and 20 of metal are created by conventional methods of first depositing of a layer of dielectric (not shown) over the surface of the layer 14 of passivation for the creation of metal layer 16 and by selectively creating layers 18 and 20 over the surface of the created layer 16. Metal layer 16 is created by patterning and etching a deposited layer of dielectric (not shown), creating an opening through the deposited layer of dielectric that aligns with the metal pad 14 and that partially exposes the surface of the metal pad 14. Layer 16 of metal is in contact with the surface of the metal pad 14 inside opening created through the layer 14 of passivation. A layer 18 of metal, typically using Under-Bump-Metallurgy (UBM), is created over the layer 16 of metal using methods of plating and the like. The region of layer 18 of metal that is above the metal pad 14 will, at a later point in the processing, form a pedestal over which the interconnect bump will be formed. This pedestal may further be extended in a vertical direction by the deposition and patterning of one or more additional layers, such as layer 20, FIG. 1.

A layer of photoresist (not shown) is deposited, patterned and etched, creating an opening that aligns with the contact pad 12 and has a diameter about equal to the surface area of the upper surface of layer 20. The opening created through the deposited layer of dielectric is filled with solder, typically using methods of solder printing.

A solder paste or flux (not shown) is now applied to the layer 22 of solder, the solder 22 is melted in a reflow surface typically under a nitrogen atmosphere, creating the spherically shaped interconnect bump 22 that is shown in FIG. 1.

The preferred materials for the various layers that are shown in cross section in FIG. 1 are as follows:

For Layer 16 copper is the preferred metal

For Layer 18 nickel is the preferred metal, and

For Layer 20 gold is the preferred metal.

The selection of the materials that are used for the various overlying layers is determined by considerations of inter-layer adhesion, metal diffusion, metal corrosion, issues of layer delamination and the like.

Increased device density brings with it increased closeness of components and elements such as solder bumps that are part of the created semiconductor device packages. This increased closeness is expressed as a reduction in the spacing or "pitch" between solder bumps of a semiconductor device package. State-of-the-art technology uses solder bumps having a pitch of about 200 μm, which imposes a limitation on further increasing device density. The limitation in further reducing the pitch of solder bumps is imposed by concerns of reliability, which impose a relatively large ball size for the solder bump. This relatively large solder ball restricts further reducing the solder ball pitch.

In the majority of applications, solder bumps are used as interconnections between I/O bond pads and a substrate or printed circuit board. Large solder balls bring with it high standoff since a solder ball with high standoff has better thermal performance (CTE mismatching is easier to avoid resulting in reduced thermal stress on the solder balls). Large solder balls are therefore required in order to maintain interconnect reliability. Low-alpha solder is applied to avoid soft error (electrical or functional errors) from occurring, thereby eliminating the potential for inadvertent memory discharge and incorrect setting of the voltage {1 or 0}.

The cross section that is shown in FIG. 2 is essentially the same as the cross section shown in FIG. 1 with the exception that in FIG. 2 the solder 22' overlies and covers the base layers 16, 18 and 20. This application reduces the potential exposure of for instance the copper of layer 16 to the environment, thereby reducing the potential for corrosion of the copper surface. The application that is shown in cross section in FIG. 2 further improves solder bump 22' reliability and reduces lamination exposure.

As previously highlighted, high-density, high-performance semiconductor device packages require solder bumps of reduced bump pitch, increased bump height and reduced bump cross section. Conventional technology as highlighted above using FIGS. 1 and 2 are limited in this respect by being limited in all three of the indicated requirements of bump creation. A number of technologies create overlying layers that form part of a solder bump by creating a photoresist mask using a one-step photoresist exposure and development process. This typically requires a relatively thick layer of photoresist, which introduces design parameters of the created solder bump that are contrary to the desired design parameters of solder bump pitch, cross section and height.

The solder bumps that have been shown in cross section in FIGS. 1 and 2 are created by first creating the patterned and developed photoresist mask, then plating the layers 16 of copper, the layer 18 of nickel and the layer 20 of gold. The photoresist mask is then removed after which solder is applied over the surface of the created layer 20 of gold using methods of solder stencil printing. This method however results in a solder bump of considerable height and is limited in providing solder bumps of required cross section and required solder bump pitch. The invention provides a method that addresses these concerns.

The invention will now be described in detail using FIGS. 3 through 9 for this purpose.

Figure 3:
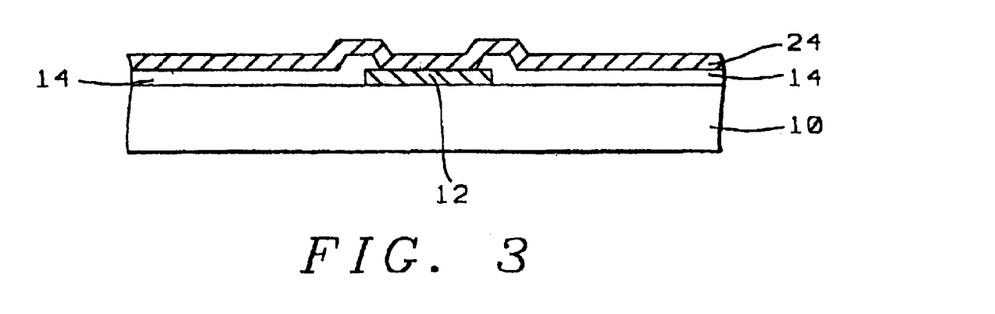
FIG. 3 shows the cross section of a semiconductor surface over the surface of which a contact pad, a patterned and etched layer of passivation and a layer of UBM have been created.

Referring first specifically to the cross section shown in FIG. 3, there is shown a semiconductor surface 10, such as the surface of a substrate, over which a contact pad 12 has been created. A patterned and etched layer 14 of passivation material is deposited over the surface of layer 10, an opening (not highlighted) created through the layer 14 of passivation exposes the surface of the contact pad 12. A layer 24 of Under-Bump-Metallurgy (UBM), typically of Ti/Ni/Cu and of a thickness between about 0.5 and 2 μm, is electroplated over the surface of the patterned and etched layer 14 of passivation.

Figure 4:
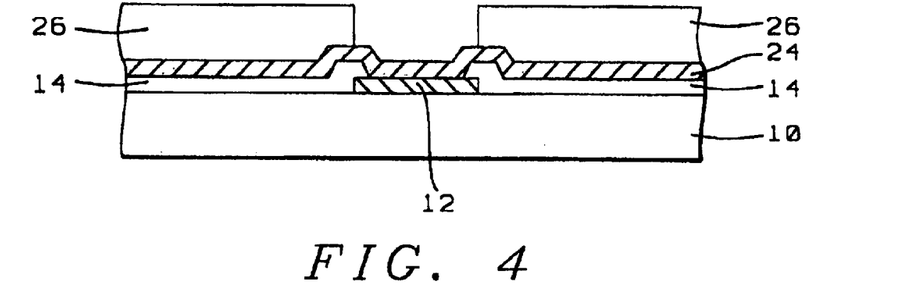
FIG. 4 shows a cross section after a first mask of dry film has been created.

The cross section that is shown in FIG. 4 shows a patterned and developed layer 26 of dry film. Layer 26 of dry film is laminated over the surface of the layer 24 of UBM and then patterned and developed using conventional methods of photolithographic exposure and development.

A layer of dry film conventionally comprises a photopolymer, which is an aqueous processable dry film resist that is designed for alkaline and acid etch applications and for pattern plating in copper, tin, tin/lead, Ni and Au. The chemical composition of a dry film comprises a multifunctional acrylic monomer.

The preferred dry film of the invention is of a negative type photo-polymer. This results in surface areas of the layer of dry film that, when exposed by G, H and I line UV light, will remain over the surface of the wafer while unexposed surface areas will be removed by applying for instant an alkaline solution to the surface thereof.

The preferred, thickness of the laminated layer 26 is between about 70 and 150 μm but more preferably about 100 μm.

Figure 5:
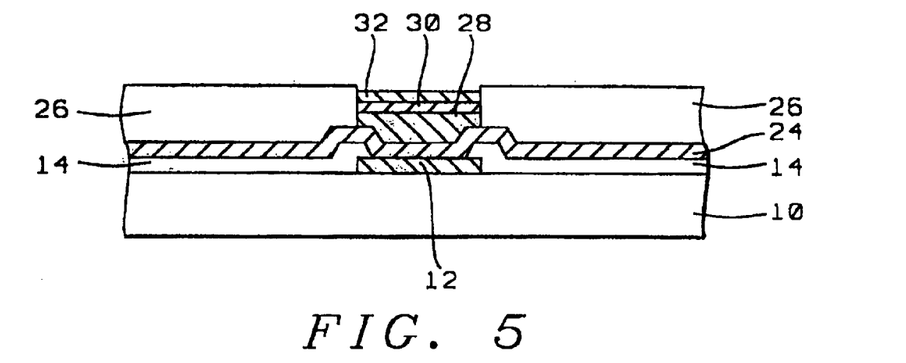
FIG. 5 shows a cross section after the base for the torch bump has been created.
Figure 6:
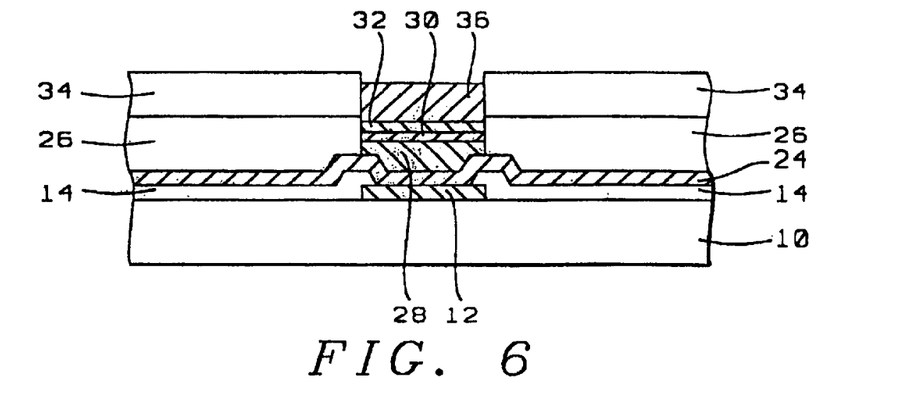
FIG. 6 shows a cross section after a second mask of dry film has been created, a layer of solder has been deposited.

The invention continues, FIG. 5, with the formation of a base for the torch solder bump by electroplating the layers 28, 30 and 32, using an electroplating process to have each layer have a completely flat top area. The preferred metals for the three indicated and highlighted layers are as follows:

For Layer 28, copper is the preferred metal
For Layer 30, nickel is the preferred metal, and
For Layer 32, gold is the preferred metal.

As an alternate to the deposition of the three layers 28, 30 and 32, the invention also provides for the deposition of a high-lead solder paste over which eutectic solder paste is deposited. The high-lead solder paste may be deposited instead of the layer 28 of copper after which layers 30 (of nickel) and 32 (of gold) are deposited with the layer of eutectic solder paste being deposited over the surface of the plated layer 32 of gold. For other applications, the layers 30 of nickel and 32 of gold may be omitted in which case the eutectic solder paste is deposited directly over the surface of the deposited layer of high-lead solder. For these applications, since the melting point of the high-lead solder is higher than the melting point of the eutectic solder paste, only the deposited layer of eutectic solder paste will reflow during solder ball reflow.

In the cross section of FIG. 5, the highly reflective layer 32 of gold is the upper layer which, due to its high degree of reflectivity, can be used as an alignment mark for the following exposure of a second laminated dry film layer. This lamination of a second dry film layer is shown in cross section in FIG. 6 after the second dry film layer 34 has been patterned and developed again using conventional methods of photolithographic exposure and development. The opening that has been created through the second dry film layer 34 is aligned with the contact pad 12 and therefore with the plated layers 28, 30 and 32. The opening created through the second dry film layer 34 is filled with a layer 36 of solder.

Figure 7:
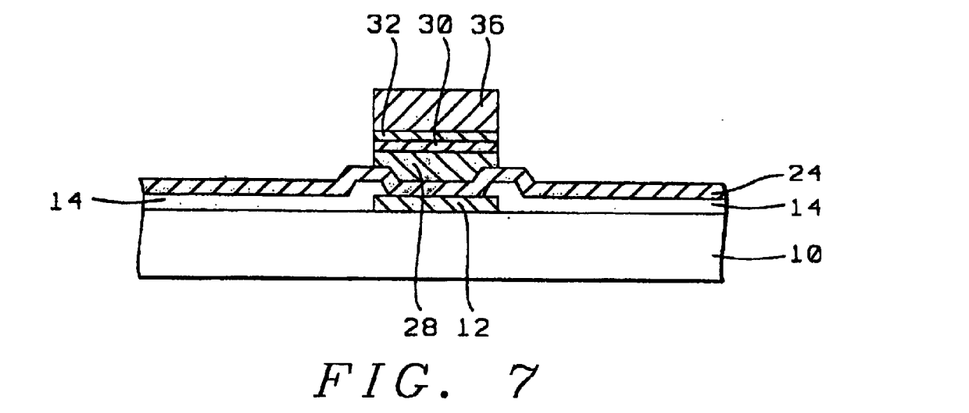
FIG. 7 shows a cross-section after the first and second mask of dry film have been removed.

By now removing the layers 26 and 34 of dry film, the structure that is shown in cross section in FIG. 7 is obtained. Using the created torch bump column 28/30/32/36 as a mask, the layer 24 of UBM is etched, the results of this etch have been highlighted in the cross section of FIG. 8. Wet etching is the preferred method to etch the UBM layer 18.

Figure 8:
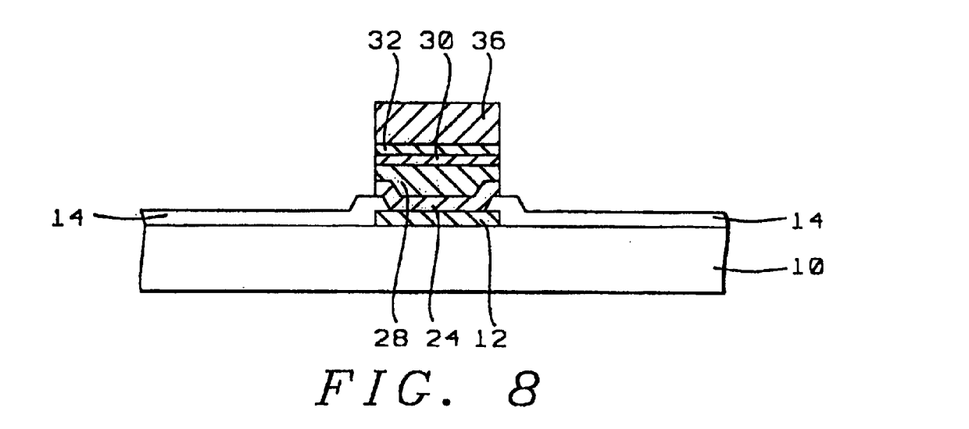
FIG. 8 shows a cross section after the layer of UBM has been etched.
Figure 9:
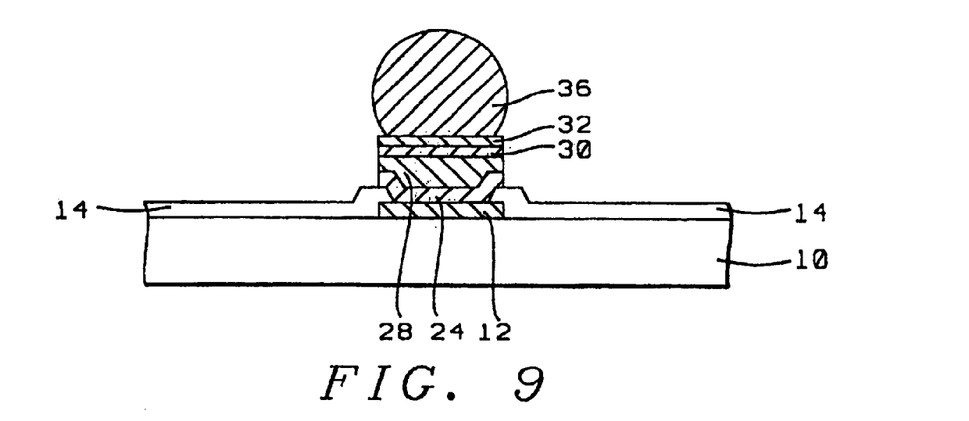
FIG. 9 shows a cross section after the step of reflow of the deposited solder.

The structure that is shown in cross section in FIG. 8 is ready for solder reflow, creating a torch bump from the layer 36 of solder, shown in cross section in FIG. 9. The torch bump 36 has a flat bottom area by which it is a bonded to the larger flat top area of the layer 32.

To review the prior art process:

A semiconductor surface of provided, a contact pad having been provided over the semiconductor surface, a patterned and etched layer of passivation having been provided over the semiconductor surface, exposing the surface of the contact pad A layer of UBM is electroless plated over the surface of the layer of passivation, including the opening created through the layer of passivation A photomask is created over the layer of UBM, an opening created through the photomask is aligned with the contact pad Deposited are, in alignment with the opening created through the photomask, layers of metal that form the base of the solder ball, such as a layer of copper followed by a layer of nickel followed by a layer of gold after which and using the same photomask, a layer of solder is deposited The photomask is removed, and Reflow is applied to the deposited layer solder.

Figure 10:
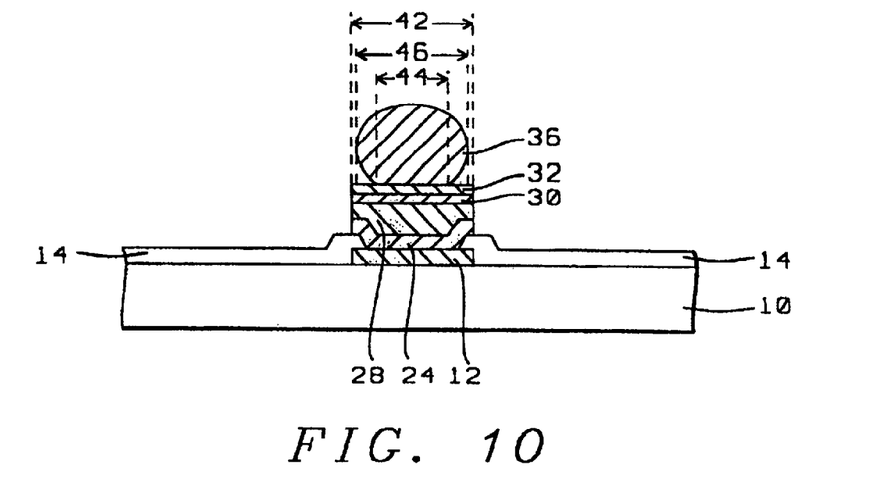
FIGS. 10 through 12 show various dimensional configurations of the torch bump of the invention.
Figure 11:
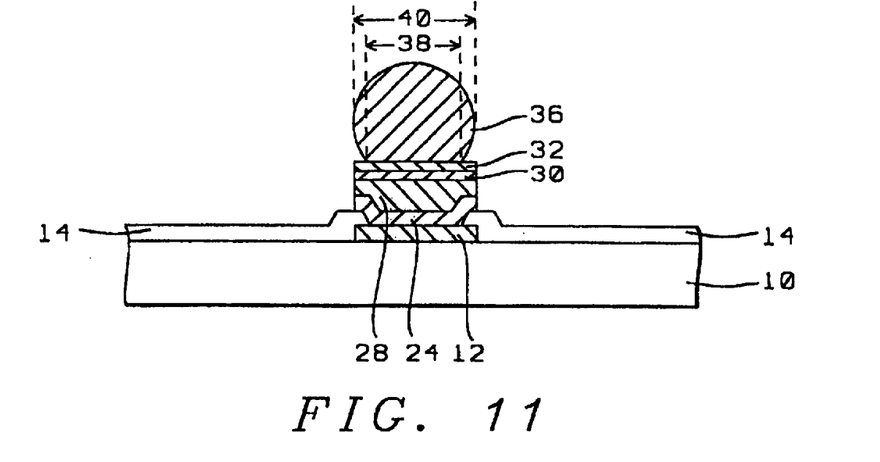
Figure 12:
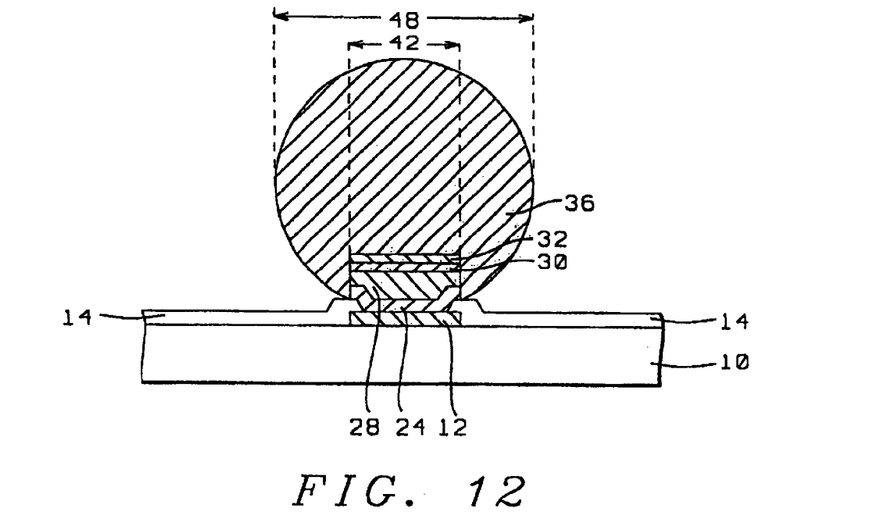

To review and add to the invention:

The invention creates a torch bump, so called because the solder bump is created over and aligned with an underlying base layer forming in this manner a shape that resembles a torch The torch bump comprises a base and a solder bump overlying the base The solder bump can be created having a diameter of about 100 μm The base layer preferably comprises a first or lower layer of copper, created to a thickness of about 90 μm, a second or center layer of nickel, created to a thickness of about 5 μm and a third or upper layer of, gold, created to a thickness of about 5 μm The torch bump of the invention is created using a two-layer dry film process The lower or first layer of dry film is used for plating the base layer of the torch bump The base of the torch solder bump is used as the alignment mark for the patterning and development of the second layer of dry film The upper or second layer of dry film is used for solder plating of the torch bump The invention provides for creating the base of the torch bump using overlying layers of high-lead solder as a lower layer over which a layer of eutectic solder is pasted; layers of seed and barrier material may or may not be used in combination with these layers of high-lead solder and the layer of eutectic solder The creation of the torch bump comprises a two step plating process, a first plating process for the creation of the Cu/Ni/Au base of the torch bump, a second plating process provides solder plating for the solder bump The invention provides for the creation of an ultra-fine pitch solder bump The height of the torch bump equals two times the height of a dry film mask In comparing the invention with conventional methods of creating a solder bump, whereby a one-time photolithographic masking and exposure process is used combined with a relatively thick layer of exposure mask, the advantage that is provided by the two-mask process of the invention is that the invention solves problems of low-resolution caused by an ultra-thick layer of dry film in addition to problems of photolithography alignment By adjusting the ratio of opening height to opening diameter of the opening that is created through the second layer of dry film, the size of the solder ball with respect to the size of the base of the torch bump can be controlled, this is highlighted in FIGS. 10 through 12, as follows 1. FIG. 10 shows. a cross section whereby the diameter 42 of the base is larger than the largest diameter 46 of the solder ball which is larger than the diameter 44 of the contact surface between the solder ball and the base of the torch bump
2. FIG. 11 shows a cross section whereby the diameter 42 of the base is equal to the largest diameter 40 of the solder ball which is larger than the diameter 38 of the contact surface between the solder ball and the base of the torch bump, and
3. FIG. 12 shows a cross section whereby the diameter 42 of the base is smaller than the largest diameter 48 of the solder balls of the torch bump.

Figure 13:
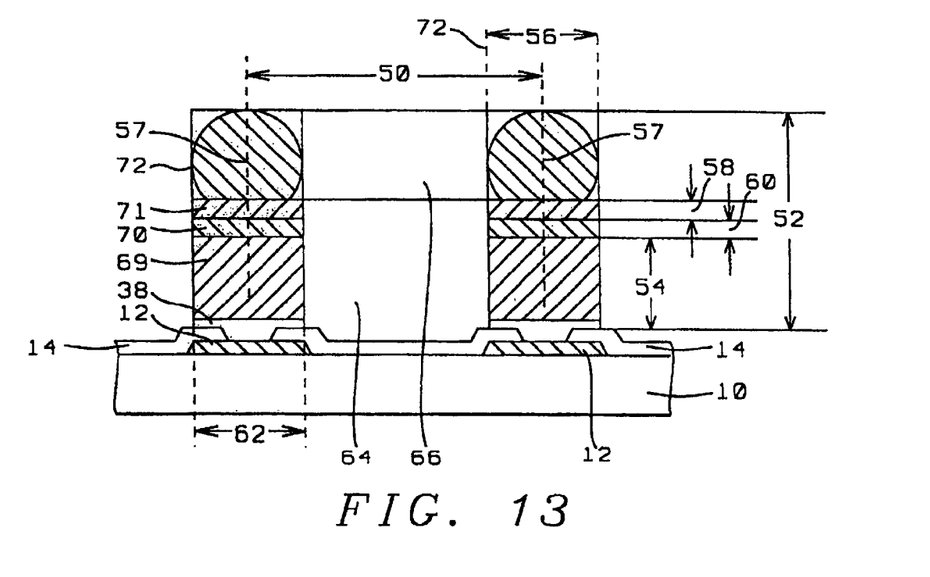
FIG. 13 shows a cross section of two torch bumps of the invention created side-by-side, dimensions are highlighted.

The cross section that is shown in FIG. 13 is presented in order to highlight dimensions of the torch bump where two torch bumps are created in adjacency to each other. The following parameters and structural details are highlighted in the cross section of FIG. 13:

10, the surface of a substrate
12, bond pads created over the surface of substrate 10
14, a patterned and etched layer of passivation
50 and 52, equal to about 200 $\mu$m
54, equal to about 90 $\mu$m
56 and 62, equal to about 100 m
57, two lines running through the center of the solder bumps 72 in a direction that is perpendicular to the plane of the substrate 10
58 and 60, equal. to about 5 $\mu$m
64, a first dry film having a thickness of about 4 mil
66, a second dry film having a thickness of about 4 mil
68, a UBM layer
69, a copper base
70, a barrier layer preferably comprising nickel
71, a protective layer preferably comprising gold, and
72, a torch bump.

Figure 14:
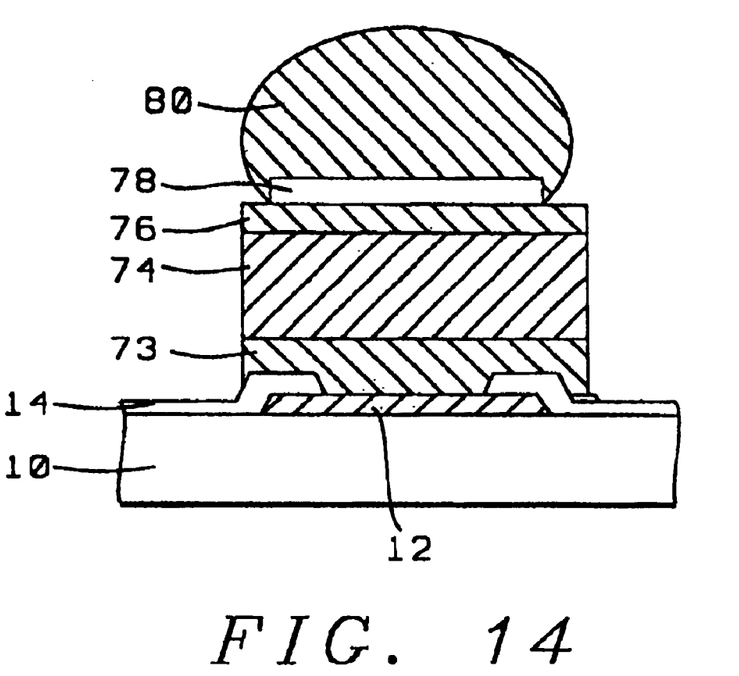
FIG. 14 shows a cross section of yet another creation of a torch bump.

FIG. 14 shows yet one more application of the invention wherein are highlighted:

10, the surface of a substrate
12, bond pads created over the surface of substrate 10
14, a patterned and etched layer of passivation
73, a patterned and etched layer of UBM
74, the base of the torch bump, such as a layer of copper or a layer of high-lead solder
76, a non-solder wettable layer
78, a solder wettable layer, and
80, the solder bump of the torch bump.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for a torch bump, comprising:
    a substrate having been provided with a contact pad over the surface thereof;
    layer of passivation over the surface of the substrate and exposing the surface of said contact pad;
    a UBM over the surface of the layer of passivation including the exposed surface of the contact pad; and
    a base of said torch bump overlying said contact pad and having a flat top area, said base having said torch bump bonded to the flat top area at a flat bottom area of said torch bump, said flat top area larger than the flat bottom area.

2. The structure of claim 1, said base of said torch bump further comprising a first layer, a second layer on the first layer, and a third layer on the second layer.

3. The structure of claim 1, said base of said torch bump further comprising:
    a first layer of copper having been deposited over the exposed surface of said layer of UBM;
    a second layer of nickel having been deposited over said first layer of copper; and
    a third layer of gold having been deposited over the surface of said second layer of nickel.

4. The structure of claim 3, said first layer of copper having been deposited to a thickness of about 90 $\mu$m.

5. The structure of claim 3, said second layer of nickel being deposited to a thickness of about 5 $\mu$m.

6. The structure of claim 3, said third layer of gold having been deposited to a thickness of about 5 $\mu$m.

7. The structure of claim 2, wherein the top of the first layer is flat.

8. The structure of claim 1, said base of said torch bump further comprising:
    a first layer of solder having been deposited over the exposed surface of said layer of UBM; and
    a second layer of eutectic solder paste having been deposited over said first layer of solder.

9. The structure of claim 8, whereby additionally a layer of nickel having been deposited over the surface of said first layer of solder after which a layer of gold having been deposited over the surface of said layer of nickel after which said second layer of eutectic solder paste having been deposited over the surface of said layer of gold.

10. The structure of claim 1, said layer of UBM comprising nickel.

11. The structure of claim 10, said nickel having been deposited to a thickness between about 1 and 10 $\mu$m.

12. The structure of claim 1, additionally said layer of UBM having been etched using said created base of said torch bump and said created layer of solder as a mask.

13. The structure of claim 2, wherein the first layer, the second layer, and the third layer have flat top areas.

14. The structure of claim 1, wherein the diameter of the base of said torch bump is larger than the diameter of the torch bump which is larger than the diameter of the flat bottom area.

15. The structure of claim 2, wherein the third layer is flat.

16. The structure of claim 2, wherein the third layer is gold.

* * * * *

UNITED STATES PATENT AND TRADEMARK OFFICE
CERTIFICATE OF CORRECTION

PATENT NO. : 6,940,169 B2
APPLICATION NO. : 10/791095
DATED : September 6, 2005
INVENTOR(S) : Jin et al.

It is certified that error appears in the above-identified patent and that said Letters Patent is hereby corrected as shown below:

Column 1, line 7, delete "U.S. Pat. No. 6,140,577" and insert therefor --U.S. Pat. No. 6,740,577--

Column 5, line 63, delete "it is a bonded" and insert therefor --it is bonded--

Column 8, claim 1, line 6, delete "layer of" and insert therefor --a layer of--

Signed and Sealed this

Fourteenth Day of April, 2009

JOHN DOLL
*Acting Director of the United States Patent and Trademark Office*